United States Patent [19]

Duret et al.

[11] Patent Number: 5,221,897
[45] Date of Patent: Jun. 22, 1993

[54] DIRECTIONAL RESONANCE MAGNETOMETER

[75] Inventors: Denis Duret, Grenoble; Marc Beranger, Meylan, both of France

[73] Assignee: Commissariat a l'Energie Atomique, Paris, France

[21] Appl. No.: 714,626

[22] Filed: Jun. 13, 1991

[30] Foreign Application Priority Data

Jun. 25, 1990 [FR] France ................. 90 07946

[51] Int. Cl.$^5$ .............................................. G01V 3/00
[52] U.S. Cl. ..................................... 324/302; 324/301
[58] Field of Search ............... 324/301, 302, 307, 308, 324/314, 317, 318, 322

[56] References Cited

U.S. PATENT DOCUMENTS

| 3,191,118 | 6/1965 | Jung et al. ............... 324/301 |
| 3,495,163 | 2/1970 | Salvi ........................ 324/301 |
| 4,623,844 | 11/1986 | Macovski ................. 324/320 |
| 4,814,707 | 3/1989 | Marton ..................... 324/304 |
| 4,916,393 | 4/1990 | Crescini et al. ........... 324/301 |
| 4,996,311 | 2/1991 | Moussavi et al. .......... 324/301 |

FOREIGN PATENT DOCUMENTS

| 0240221 | 10/1987 | European Pat. Off. . |
| 0359598 | 3/1990 | European Pat. Off. . |
| 0273129 | 11/1989 | Fed. Rep. of Germany . |
| 1210840 | 11/1970 | United Kingdom ................ 324/301 |
| 1551236 | 8/1979 | United Kingdom . |

OTHER PUBLICATIONS

Article by K. Weyand, published in IEEE Transactions on Instrumentation and Measurement, vol. 38, No. 2, Apr. 1989, pp. 410 to 414.

Primary Examiner—Louis Arana
Attorney, Agent, or Firm—Oblon, Spivak, McClelland, Maier & Neustadt

[57] ABSTRACT

It is used for measuring a magnetic-field Hlex, which is the projection, in a given direction, of a field Hex and which incorporates a sample (2) containing resonant spins, first means (4) for exciting the resonance and detecting the latter, second means (32) for producing a polarization field Hb in accordance with the direction and compensating Hlex, processing and closed loop control means (6, 8, 16 to 20, 34 to 38, 48 to 52, 40, 44), which are connected to the first and second means and which make it possible to obtain voltages proportional to Hb−Ho+hlex and to Ho−Hb+Hlex in the vicinity of the resonance, Ho being the value of the field at resonance, with Ho being well above Hex, and a pulsed square-wave current for inducing Hb and for supplying a voltage proportional to Hlex in particular to the second magnetic means.

28 Claims, 12 Drawing Sheets

FIG. 1
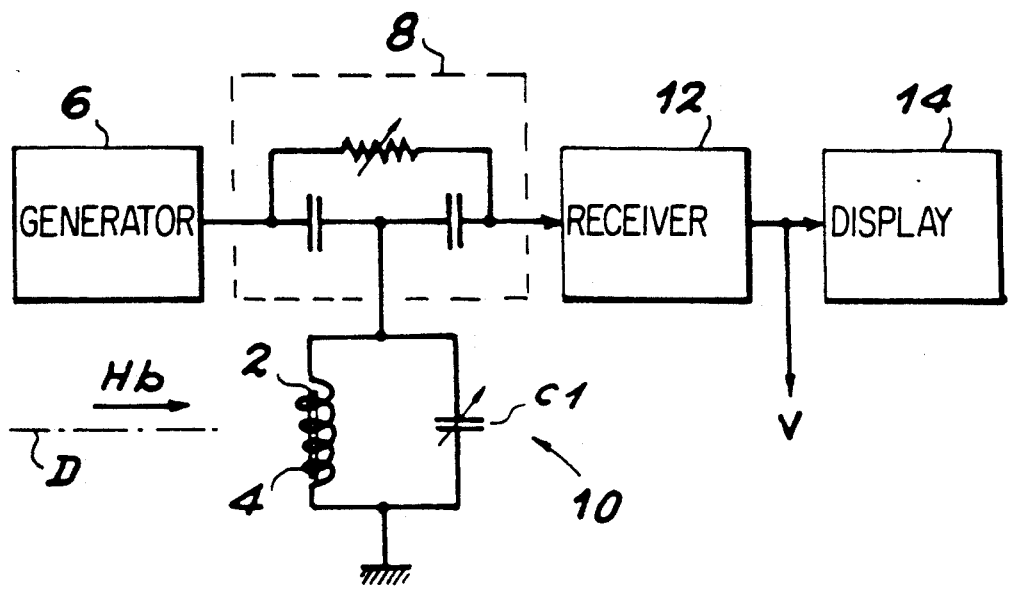
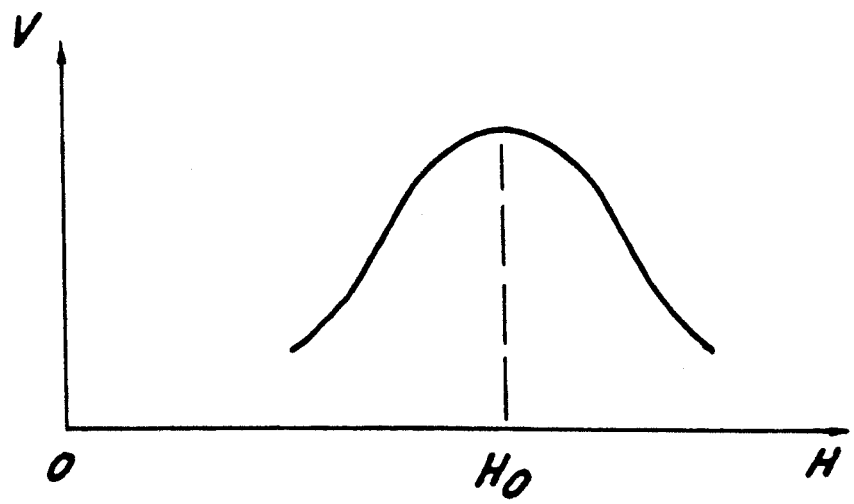
FIG. 2

DIRECTIONAL RESONANCE MAGNETOMETER

BACKGROUND OF THE INVENTION

1. Field of the Invention

The present invention relates to a directional resonance magnetometer. The latter is more particularly intended for the measurement of weak magnetic fields, e.g. approximately 0 to 100 microteslas.

Thus, particular applications of the invention are in geophysics, mining prospecting and space detection.

The magnetometer according to the invention is directional, i.e. it is associated with one measurement direction and the magnetometer makes it possible to determine the value of the projection of a magnetic field, which is a vector quantity, on the measurement direction.

The pass band of such a magnetometer is between 0 and 10 Hz and can even extend to a few kHz.

The expression of the resolution of the magnetometer must take account several parameters:

a) the spectral density of the noise brought to the input, the density being a function of the measurement frequency f in the general case and expressed in $n/T.Hz^{\frac{1}{2}}$.

b) the existence of a noise in $f^{-a}$, where a is an integer, which generally increases at low frequencies, c) the drift during time and as a function of temperature and d) the stability of the zero with the presence or absence of a false zero.

2. Discussion of the Background

Directional magnetometers of the flux gate type are already known and a good description thereof is provided in a document (1) by F. M. Neubauer et al, The Giotto Magnetometer Experiment, J. Phys. E:Sci. Instrum., 20, 1987, pp. 714 to 720 which, like the other documents cited hereinafter, is mentioned at the end of the present description.

The noise limit of such flux gate magnetometers is approximately 10 pT. Zero stability effects exist in such magnetometers, which have very high performance characteristics, but are expensive. If such a magnetometer is exposed to high magnetic fields, impacts or pressures, its characteristics can be very detrimentally affected.

In addition, U.S. Pat. No. 3,191,118 and the reference to D. Bourdel et al., An Electronic Resonance Magnetometer, Performance Optimization, Revue de Physique Appliquee, Vol. 5, February 1970, pp. 188 to 190, and D. Bourdel et al., Improvement To The Sensitivity Of Paramagnetic Resonance Magnetometers, Revue de Physique Apliquee, Vol. 7, March 1972, pp. 23 to 27, disclose directional resonance magnetometers.

Known directional flux gate magnetometers and directional resonance magnetometers suffer from the disadvantages referred to hereinafter.

Flux gate magnetometers suffer from drifts in time and as a function of the temperature. They are subject to a false zero phenomenon (i.e. they give a response which is not necessarily zero in the presence of a zero magnetic field) and are irreversibly sensitive to high magnetic fields, shocks and pressures.

The known directional resonance magnetometers have large overall dimensions (their volume possibly extending to several dm³), while having a low resolution of approximately 1 nT.

The present invention proposes a directional resonance magnetometer, whose performance characteristics are identical to those of the flux gate type, while having limited thermal and time drifts, which is not subject to the false zero phenomenon and whose sensitivity to high magnetic fields, shocks, impacts and pressure is reversible. Moreover, the size of the magnetometer according to the present invention can be reduced to a few millimeters.

Reference will subsequently be made in connection with FIGS. 1 to 6 to various devices known from the magnetometry and spectrometry fields.

FIG. 1 diagrammatically shows a magnetometer known from the above-cited document D. Bourdel et al., An Electronic Resonance Magnetometer, Performance Optimization, Revue de Physique Appliquee, Vol. 5, February 1970, pp. 187 to 190 (see FIG. 4 therein). In this magnetometer, a sample 2 made from a material having resonant electron spins is exposed to a magnetic polarization field Hb and an external magnetic field to be measured Hex, the latter being e.g. the earth's magnetic field. The polarization field Hb is created by any appropriate means, e.g. a not shown magnetic coil placed in the vicinity of the sample and which is supplied by a current having a variable intensity.

The magnetometer of FIG. 1 also has an exciting and receiving coil 4 surrounding the sample 2. The axis of the coil 4 is perpendicular to the direction D of the polarization field Hb, which is the measurement direction of the magnetometer of FIG. 1.

In the case where the electron spins resonate, the resonant frequency fo of these electron spins is given by the Larmor relation:

$$fo = g.Mo.Ho/(2pi)$$

with

Mo = 4 pi.10⁻⁷ H/m, g: gyromagnetic ratio of the electron (g/2pi=28 GHz/T),

Ho: magnetic field applied to the spins at resonance (expressed in A/m), pi: well-known symbol representing approximately 3.1416.

A high frequency generator 6 set to fo excites the resonance via a measuring bridge 8 and the coil 4, which forms part of a resonant circuit 10. The latter is tuned to the frequency fo and comprises, apart from the coil 4, a variable capacitor c1 connected between the terminals of the coil 4. The resonance is detected by means of the coil 4, the measuring bridge 8 and a receiver 12, which has an amplitude detection. The measuring bridge 8 serves to decouple the reception from the excitation.

It is pointed out that the measuring bridge 8 can be eliminated, provided that there is a coil emitting both orthogonally to the direction D and to the axis of the coil 4, connected to the generator 6, the resonant circuit 10 in this case being only connected to the receiver 12.

An observation device 14 receives at its input a detected voltage V supplied by the output of the receiver 12. The device 14 supplies a curve, which is shown in FIG. 2 and which represents the variations of the voltage V as a function of the magnetic field H applied to the electron spins. It is an absorption curve with a gaussian shape. Resonance takes place when H is equal to Ho. The field applied H is the vector sum of the polarization field Hb and the external field to be measured Hex.

A field Ho much higher than the field Hex is chosen, so that H can approximately be expressed by the following formula:

$$H = Hb + (Hex \cdot cosTh)$$

in which Th is the angle between the vectors, which represent Hb and Hex, which confirms the directional character of the magnetometer. It should be noted that this formula makes it possible to determine Hex, knowing Th, Ho and the value Hbo of Hb, which leads to Ho.

Apart from obtaining this simple formula another interest of having Ho very high is that the signal-to-noise ratio (s/n ratio) of the magnetometer is, at a first approximation, proportional to $fo^2$ and therefore $Ho^2$.

FIGS. 1 to 3 of the document to D. Bourdel et al., An Electronic Resonance Magnetometer, Performance Optimization, Revue de Physique Appliquee, Vol. 5, February 1970, pp. 187 to 190 show constructional variants of the magnetometer diagrammatically shown in FIG. 1 of the present description.

A device disclosed in French Patent Application 8809830 and EP-A-0359598 from the spectrometry field, but which is not used in the magnetometry field is diagrammatically shown in FIG. 3 and reveals a coherent detection of the high frequency.

The device of FIG. 3 uses the sample 2, the field Hb, the coil 4, the generator 6, the measuring bridge 8 and the resonant circuit 10 of FIG. 1, arranged in the same way and also has a low noise amplifier 16, a balanced mixer 18 and a low-pass filter 20.

The high frequency signal which is available at the output of the measuring bridge 8 is amplified by the amplifier 16 and is supplied to the input of the balanced mixer 18, whose reference signal is an "image" of the high frequency excitation.

More precisely, this reference signal is a signal having the same frequency as that of the excitation signal supplied by the generator 6 to the measuring bridge 8, but whose amplitude and phase can be made different from those of the latter signal.

The output of the mixer 18 is filtered by the low-pass filter 20 in order to eliminate the residues, as well as the harmonics of the high frequency.

By connecting to the output of the low-pass filter 20 an appropriate, but not shown observation device, it is possible to obtain, as a function of the respective phases of the exciting signal and the reference signal, the curve of FIG. 2 or the curve of FIG. 4, which represents the variations of a voltage V1 as a function of the field H and which is called the dispersion curve. This curve of FIG. 4 can be used as it is for a magnetometer, with linearity and drift limits, or as a zero signal in a magnetic field close loop control device.

Another device known in the field of spectrometry and used in the magnetometry field is diagrammatically shown in FIG. 5 and makes it possible to obtain the derivative of the absorption curve. The device of FIG. 5 uses the sample 2, the field Hb, the coil 4, the generator 6, the measuring bridge 8, the resonant circuit 10, the amplifier 16 and the balanced mixer 18 of FIG. 3, arranged in the same way.

The device of FIG. 5 also has an oscillator 22, which produces a signal having an audio frequency fm, as well as a coil 24, which receives the said signal and which produces in the sample 2 a magnetic field of frequency fm, called the "agitation field" and which is superimposed on the field Hb, the axis of the coil 24 coinciding with the axis of the not shown coil used for producing the field Hb.

At the output of the balanced mixer 18, the low-pass filter 20 of FIG. 3 is replaced by a band-pass filter 26 around the frequency fm.

A phase shifter 28 receives the high frequency signal from the generator 6 and supplies the balanced mixer 18 with a signal having an adequate phase for obtaining, at the output of the mixer 18, the voltage V of the curve shown in FIG. 2.

A synchronous detection means 30 at the frequency fm and which is controlled by a reference signal from the oscillator 22, has its input connected to the output of the filter 26 and supplies at the output a voltage Vs. The reference signal has a frequency fm, but its amplitude and phase can be made different from those of the signal supplied by the oscillator 22 to the coil 24.

By connecting to the output of the synchronous detection means 30 an appropriate, but not shown observation means, it is possible to observe a curve which is shown in FIG. 6 and has no offset voltage. This curve represents the variations of the voltage Vs as a function of the field H and constitutes the derivative of the curve of FIG. 2.

The parameters making it possible to optimize the resonant materials and the respective amplitudes of the high frequency field and the agitation field are obtained by a process described in French Patent Application 8809830 and EP-A-0359598.

Thus, it is known to produce a directional magnetometer with the aid of the following means: a sample formed from an appropriate resonant material (see e.g. French Patent Application 8612278) one or more sampling and exciting coils, a device making it possible to produce a continuous polarization field Hb (close to Ho), an oscillator at resonance and an electronic means making it possible to obtain the curve of FIGS. 4 or 6.

In this case, a variation of the external field Hex, to the extent that it is well below the line width DH1 (curve of FIG. 4) or DH2 (curve of FIG. 6) leads to a resonance variation and to an image voltage at the output of the magnetometer.

The linearity can be improved by a field feedback using the voltage V1 (FIG. 4) or the voltage Vs (FIG. 6) as a zero indicator, by integrating the voltage and by reinjecting a current proportional thereto and which creates a magnetic field as a result of a coil, whose axis is parallel to the direction of Hb. Such a procedure is standard in magnetometry (see, e.g. French Patent Application 8717566).

The main disadvantage of such a magnetometer is linked with the stability of the polarization field Hb. The requisite precision can be evaluated with the aid of a following example.

Consideration is given to a field to be measured Hex of 50 microteslas with a precision of 10 pT and a polarization Hb 100 times higher than Hex, i.e. a field Hb of 5 mT. Any variation of Hb will be interpreted as a variation of Hex. Consequently the field Hb must be stable to within 10 pT, i.e. $2.10^9$ in relative precision. This is virtually impossible to achieve with known procedures.

One solution which has been tested consists of pulsating the field Hb at a frequency fp well below fo, so that the field Hb alternately describes the resonance line in a positive and negative manner see U.S. Pat. No.

3,191,118 and the references to D. Bourdel et al, An Electronic Resonance Magnetometer, Performance Optimization, Revue de Physique Appliquee, Vol. 5, February 1970, pp. 188 to 190, and D. Bourdel et al., Improvement To The Sensitivity Of Paramagnetic Resonance Magnetometers, Revue de Physique Apliquee, Vol. 7, March 1972, pp. 23, to 27. Thus, the stability problem to be solved is brought down to obtaining a short term stability over a period 1/fp.

The problem associated with the above solution is that the resonance is not exploited in its maximum sensitivity zone (see French Patent Application 8809830 and EP-A-0359598) except during a minute fraction of the scan time 1/fp, which is of the sinusoidal or triangular type.

SUMMARY OF THE INVENTION

The present invention aims at obviating all the aforementioned disadvantages by proposing a directional resonance magnetometer which, inter alia, does not have drifts liked with time or temperature and which has a better resolution than the known directional resonance magnetometers.

More specifically, the present invention relates to a directional resonance magnetometer for measuring a magnetic field Hlex, which is the projection, in a given direction, of a magnetic field Hex, said magnetometer comprising:

a sample made from a material having resonant spins and first magnetic means placed in the vicinity of the sample and which excite the resonance of the spins and for detecting the excited resonance, characterized in that it also has second magnetic means placed in the vicinity of the sample and serving to produce a magnetic polarization field Hb in accordance with the predetermined direction and for compensating the field Hlex and processing and closed loop control means connected to the first magnetic means and to the second magnetic means and making it possible to obtain voltage values respectively proportional to (Hb−Ho+Hlex) and to (Ho−Hb+Hlex) in the vicinity of resonance, Ho being the value of the magnetic field applied to the sample at resonance and being well above Hex (i.e. at least equal to approximately 10 times Hex), and a pulsed square-wave current making it possible to induce the field Hb via second magnetic means and to supply a voltage Vmes proportional to the field Hlex.

According to a preferred embodiment of the invention, the processing and closed loop control means comprise:

processing means connected to the first magnetic means and to the second magnetic means and making it possible to obtain on the one hand voltage values respectively proportional to (Hb−Ho+Hlex) and to (Ho−Hb+Hlex) in the vicinity of resonance, Ho being the value of the magnetic field applied to the sample at resonance and being well above Hex, (i.e. at least equal to approximately 10 time Hex), and on the other hand a pulsed square-wave current making it possible to induce the field Hb via second magnetic means, and closed loop control means connected on the one hand to the processing means and on the other to the second magnetic means for compensating the field Hlex and which supply a voltage proportional to the field Hlex.

The closed loop control means can incorporate an integrator, which is controlled by the closed loop control means, and a voltage-current converter, whose input is connected to the output of the integrator and whose output supplies the second magnetic means.

According to a first embodiment of the magnetometer according to the invention, the processing means comprise:

electronic means for supplying the first magnetic means by a current at the Larmor frequency corresponding to Ho and for supplying at the output a voltage signal, whose variations as a function of the magnetic field applied to the sample correspond to the dispersion curve of the sample, a first electronic device connected to the output of the electronic means and permitting a voltage gain alternatively +1 and −1, a sample and hold circuit, whose input is connected to the output of the first electronic device and whose output controls the closed loop control means, a voltage source, a second electronic device supplied by the source and permitting a voltage gain of alternatively +1 and −1, and another voltage-current converter, whose input is connected to the output of the second electronic device and which supplies the second magnetic means.

According to a second embodiment which, unlike the first, uses a synchronous detection, the processing means comprise: electronic means for supplying the first magnetic means by a current at the Larmor frequency corresponding to Ho and for supplying at the output, due to the controlled synchronous detection by a voltage signal at an audio frequency, a voltage signal, whose variations as a function of the magnetic field applied to the sample correspond to the derivative of the absorption curve of the sample, a first electronic device connected to the output of the electronic means and permitting a voltage gain of alternatively +1 and −1, a sample and hold circuit, whose input is connected to the output of the first electronic device and whose output controls the closed loop control means, a voltage source, a second electronic device supplied by said source and permitting a voltage gain of alternatively +1 and −1, and another voltage-current converter, whose input is connected to the output of the second electronic device and which supplies the second magnetic means.

According to a third embodiment, which also uses a synchronous detection, the processing means comprise:

electronic means for supplying the first magnetic means by a current at the Larmor frequency corresponding to Ho and for supplying at the output, due to th synchronous detection controlled by a voltage signal at an audio frequency, a voltage signal, whose variations as a function of the magnetic field applied to the sample, correspond to the derivative of the absorption curve of the sample, a sample and hold circuit, whose input is connected to the output of electronic means and hose output controls the closed loop control means, a voltage source, a summating means for supplying at the output a voltage signal equal to the sum of the voltage and the signal at audio frequency, an electronic device connected to the output of the summating means and permitting a voltage gain of alternatively +1 and −1, and another voltage-current convertor, whose input is connected to the output of the electronic device and which supplies second magnetic means.

BRIEF DESCRIPTION OF THE DRAWINGS

The present invention is described in greater detail hereinafter relative to non-limitative embodiments and the attached drawings, wherein show:

FIG. 1, already described, diagrammatically a known directional resonance magnetometer.

FIG. 2, already described, an absorption curve which can be obtained with the magnetometer of FIG. 1.

DESCRIPTION OF THE PREFERRED EMBODIMENTS

Figure 3:
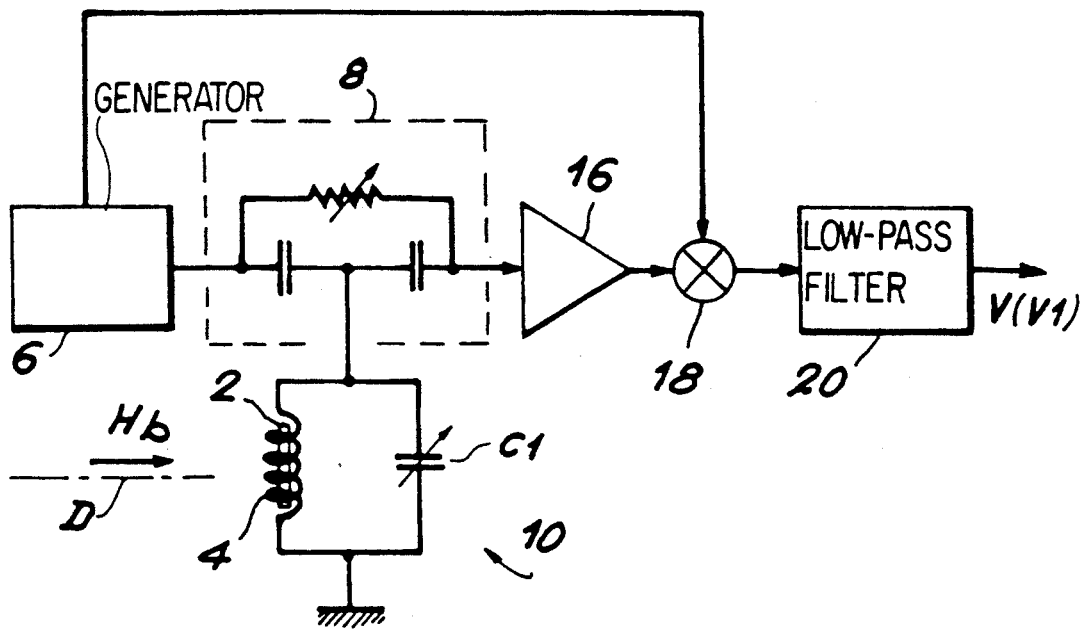
FIG. 3, already described, diagrammatically a known spectrometry device.
Figure 7:
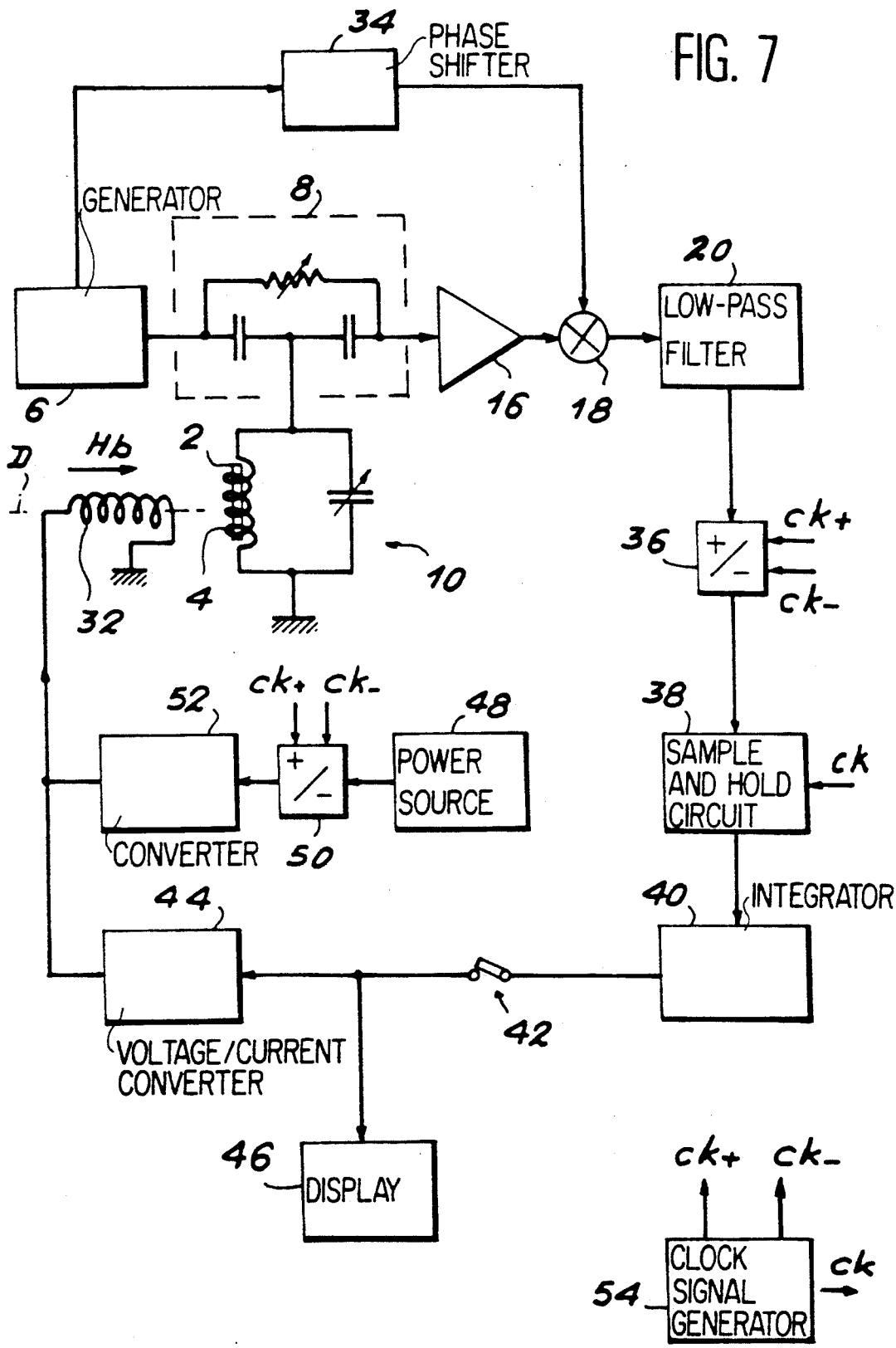
FIG. 7 a diagrammatic view of an embodiment of the magnetometer according to the invention not using synchronous detection.

The directional resonance magnetometer according to the invention and which is diagrammatically shown in FIG. 7 comprises all the elements designated 2, 4, 6, 8, 10, 16, 18 and 20 in FIG. 3 and arranged in the same way as in the latter.

The sample usable in the present invention and in particular in th e magnetometers of the drawings, is e.g. one of those described on pp. 3 and 4 of French Patent Application 8,612,278.

In the case of FIG. 7, the polarization field Hb of direction D is produced by a coil 32, whose axis is perpendicular to that of the coil 4 and which is supplied or energized in the manner described hereinafter.

Figure 4:
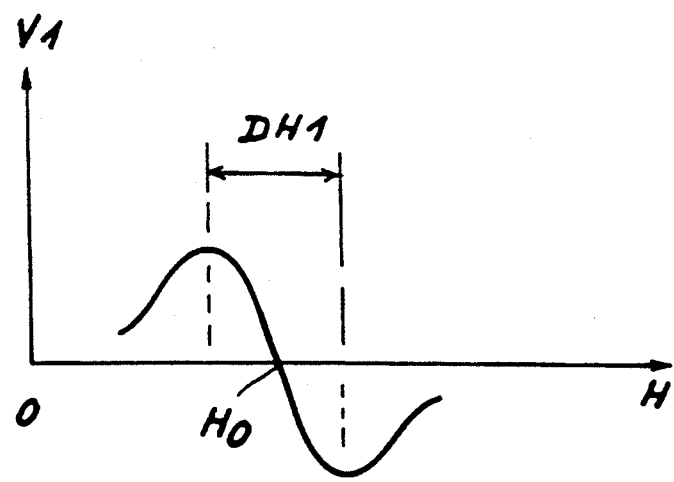
FIG. 4, already described, a dispersion curve which can be obtained with the device of FIG. 3.

The means in question also has a phase shifter 34 by means of which the high frequency signal fo of the generator 6 is applied to the balanced mixer 18 and which is regulated in such a way as to phase shift the said signal so that the low-pass filter 20 supplies at the output the voltage V1, whose variations as a function of the field applied to the sample 2 are represented by the dispersion curve of FIG. 4.

The magnetometer of FIG. 7 also has an electronic device 36, a sample and hold circuit 38 and an integrator 40, which follow the filter 20 in the aforementioned order.

The output of the integrator 40 is connected via a switch 42 (with two positions, namely off and on), to the input of a voltage-current converter 44, whose output supplies the coil 32.

At the output of the switch 42, which is on during the operation of the magnetometer of FIG. 7, are connected display means 46 making it possible to display the output voltage of the integrator 40.

The magnetometer of FIG. 7 also has a preferably stable and regulatable voltage or power source 48 which, via a device 50, identical to the device 36, and a converter 52, makes it possible to inject a stable current into the coil 32, the latter consequently producing the field Hb approximately corresponding to the frequency fo. Each of the converters 44 and 52 is e.g. an electrical resistor.

Each of the devices 36 and 50 is an electronic device controlled by pulse-type clock signals ck+ and ck− and permitting a voltage gain of +1 when the device receives a clock signal ck+ and −1 when it receives a clock signal ck−.

Figure 10:
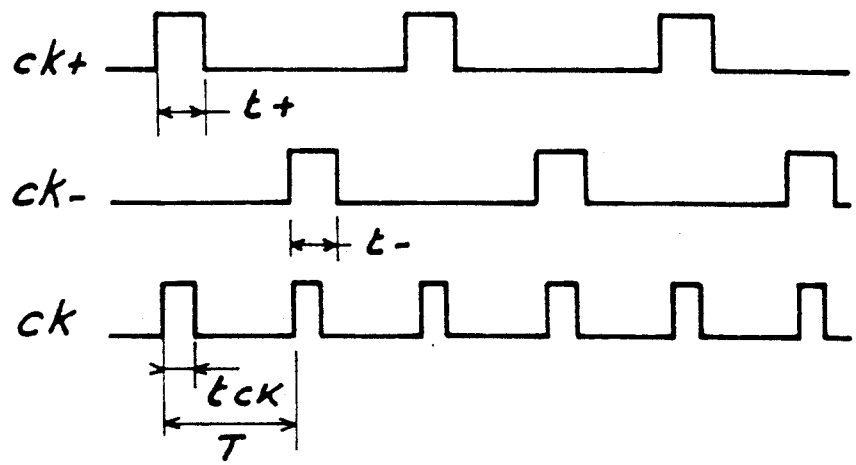
FIG. 10 a chronogram showing the clock signals used in the magnetometers of FIGS. 7 and 8.

The sample and hold circuit 38 is e.g. of the type AD585 manufactured by the Analog Device Company. It is controlled by pulse-type clock signal ck during which it "follows" the signal reaching its input and between which it stores this signal. The clock signals ck, ck+ and ck− are defined by positive voltages. A clock signal generator 54 makes it possible to appropriately control the devices 36 and 50 and the sample and hold circuit 38 by signals ck, ck+ and ck−, whose chronogram is shown in FIG. 10. This generator 54 can be in the form of a numerical counter, controlled by a clock and state decoders making it possible to obtain the chronogram of FIG. 10.

Figure 5:
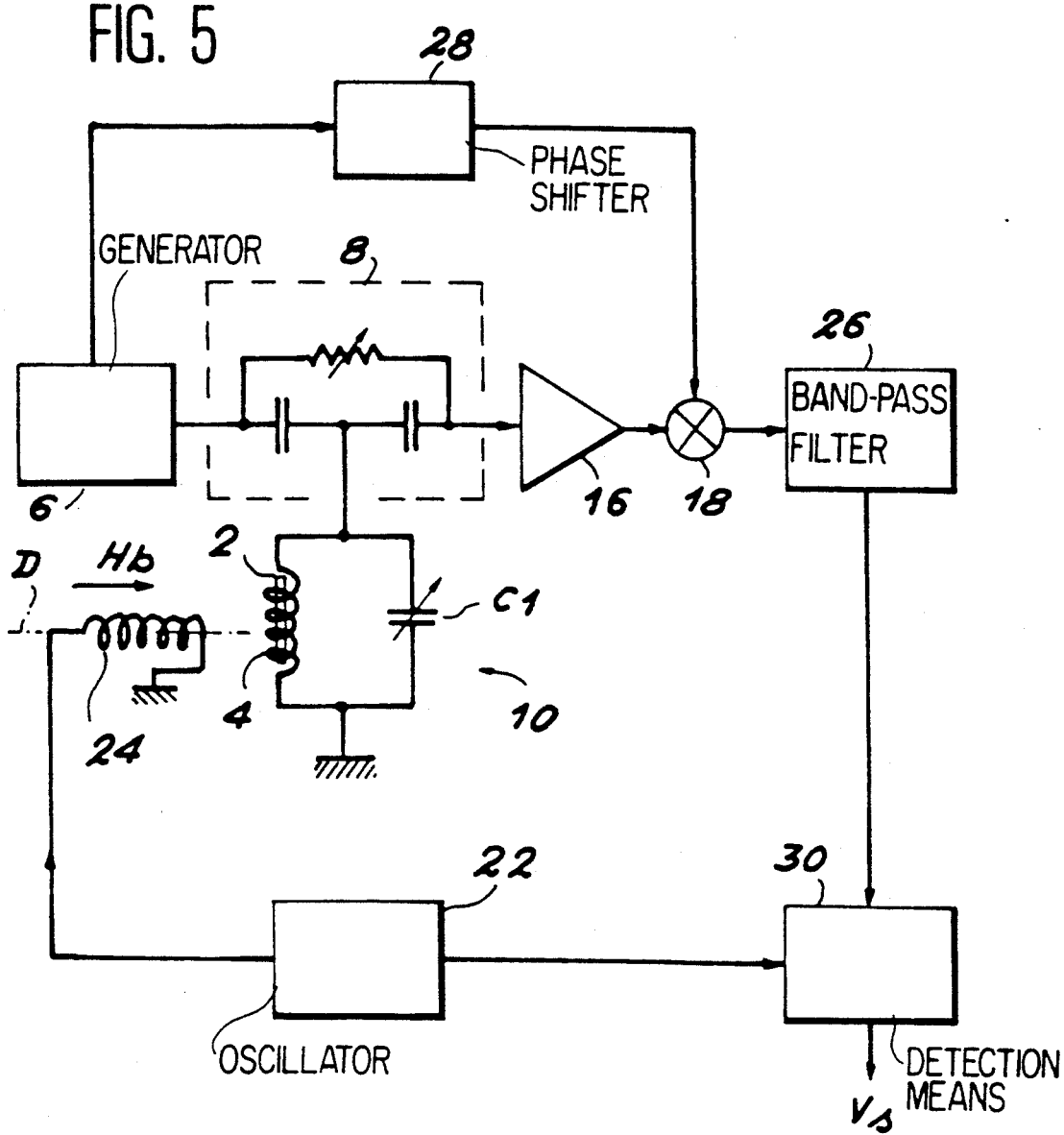
FIG. 5, already described, another known directional resonance magnetometer.
Figure 8:
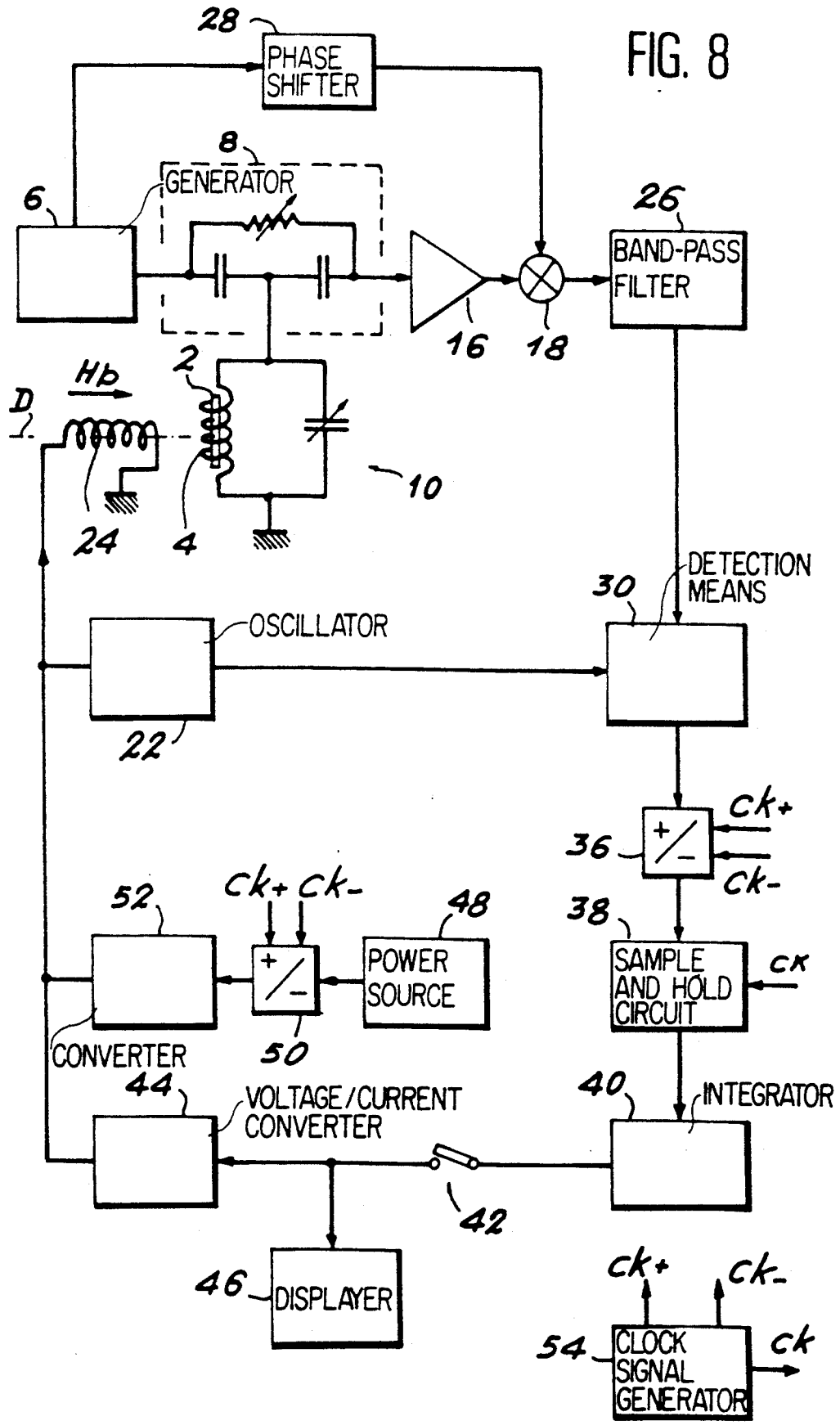
FIG. 8 a diagrammatic view of another embodiment of the magnetometer according to the invention and which uses synchronous detection.

Another magnetometer according to the invention is diagrammatically shown in FIG. 8 and uses an audio frequency synchronous detection. The magnetometer of FIG. 8 comprises all the components designated 2, 4, 6, 8, 10, 16, 18, 22, 24, 26, 28 and 30 in FIG. 5 and which are arranged in the same way as in the latter.

The magnetometer of FIG. 8 also incorporates the components 36, 38, 40, 42, 44, 46, 48, 50, 52 and 54 of FIG. 7 and arranged in the same way as in the latter, except that in the case of FIG. 8 the output of the synchronous detection means 30 is connected to the input of the device 36 and the converters 44 and 52 supply the coil 24.

Thus, in the magnetometer of FIG. 8, the polarization field Hb and the audio frequency agitation field fm are produced by the same coil 24 and are colinear. Obviously, they could be produced by two separate coils having the same axis.

In the same way, the converters 44 and 52 of FIG. 7 (respectively 8) could supply two separate coils having the same axis and not the same coil 32 (respectively 24).

Figure 6:
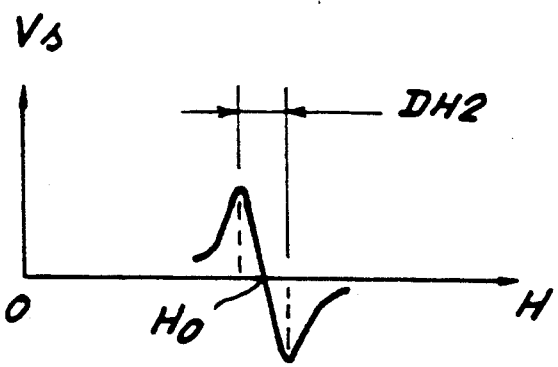
FIG. 6, already described, the curve which is the derivative of the curve of FIG. 2 and which can be obtained with the magnetometer of FIG. 5.

It should be noted that in the case of FIG. 8, the output of the synchronous detection means 30 supplies the voltage Vs, whose variations as a function of the field applied to the sample 2 are represented by the curve of FIG. 6.

Figure 9:
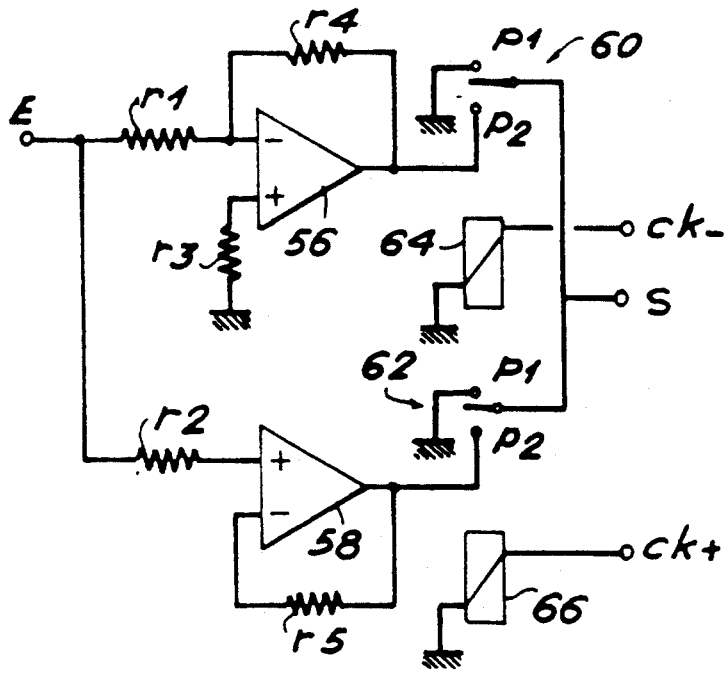
FIG. 9 diagrammatically an electronic device used in the magnetometers of FIGS. 7 and 8.

A known construction of the device 36 or 50 is diagrammatically shown in FIG. 9 and comprises two differential amplifiers 56, 58 and two electromagnetic relays 60 and 62 having two positions p1 (deenergized) and p2 (energized), the respective coils 64 and 66 being visible in FIG. 9.

The input E of the device of FIG. 9 is connected to the inverting input of the amplifier 56 across a resistor r1 and the non-inverting input of the amplifier 58 across a resistor r2. The non-inverting input of the amplifier 56 is earthed or grounded across a resistor r3. The output of the amplifier 56 is connected to its inverting input across a resistor r4. The output of the amplifier 58 is connected to its inverting input across a resistor r5.

For example, the resistors r1, r2, r4 and r5 are 100 kiloohms, while the resistor r3 is 47 kiloohms.

Between two pulses ck−, the relay 60 is in position p1 and, during each pulse ck−, in position p2, in which the output S of the device of FIG. 9 is connected to the output of the amplifier 56. Between two pulses ck+, the relay 62 is in position p1 and, during each pulse ck+, in position p2, in which the output S is connected to the output of the amplifier 58.

The chronogram of FIG. 10 will now be described. The signals ck are pulses of time width tck and period T. The signals ck+ are pulses of time width t+, which is greater than tck, and of period 2T. The signal ck− are pulses of time width t−, greater than tck, and period 2T. The pulses ck are alternatively covered by pulses ck+ and pulses ck−.

The operation of the magnetometers of FIGS. 7 and 8 will now be explained.

It will be assumed that the switch 42 is off and the field Hex is low (Ho well above Hex). The value of the current intensity I in the coil 24 or 32 is regulated in such a way that the corresponding field H (total field to which the sample is exposed) is approximately "in the centre" of the resonance (H only differing slightly from Ho).

Figure 11:
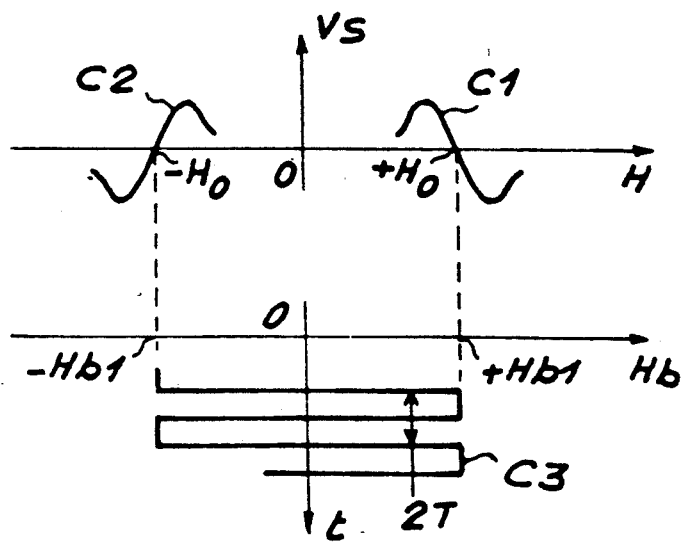
FIG. 11 magnetic field-voltage and time-magnetic field curves illustrating the operation of the magnetometers of FIGS. 7 and 8.

The variation of the voltage V1 or VS at the output of the filter 20 (or synchronous detection means 30) for a positive or negative variation of H is given by the double curve C1-C2 of FIG. 11. To facilitate the description hereinafter "VS" will stand both for V1 and VS defined hereinbefore. C1 is a curve of the type shown in FIG. 4 or FIG. 6 and C2 is symmetrical to C1 with respect to the ordinate axis VS.

During a pulse ck+ of the chronogram of FIG. 10, the voltage at the output of the filter 20 (or the synchronous detection means 30) is:

$$VS+ = -K.(Hb-Ho+Hlex)+Voff$$

K being a positive proportionality constant corresponding to the approximately linear part of the curve of FIG. 11 and Voff on offset voltage taking account of defects of the electronic equipment.

The aforementioned expression of VS+ is valid if Hex is sufficiently small for it to remain in the linear part of the curve of FIG. 11.

During a pulse ck−, the voltage at the output of filter 20 (or the synchronous detection means 30) is:

$$VS- = K.(-(Hb-Ho)+Hlex)+Voff$$

because, during a pulse ck−, one is on the side of the negative values of H and the device transforms the value Vo of the voltage supplied by the source 48 into the opposite value −Vo.

FIG. 11 shows that the polarization field Hb then varies during time in the form of square-wave pulses (curve C3) between two values Hb1 and −Hb1, Hb1 being proportional to Vo. The peak value (Hb1) of the scan corresponds to the maximum of the slope of the curve of FIG. 4 or 6 at resonance (H=Ho).

The magnetometer errors result from the variations of the voltage Vo supplied by the source 48 and Voff (which represents the drifts of the electronic equipment).

We will now demonstrate that the magnetometers of FIGS. 7 and 8 compensate for these errors. At the output of the device 36 the voltage VS is reversed during the pulse ck−.

The sample and hold circuit 38 stores its input values during the dead times and samples them during the pulses ck, which appear "in the interior" of the pulses ck+ and ck−, in accordance with the chronogram of FIG. 10.

Figure 12:
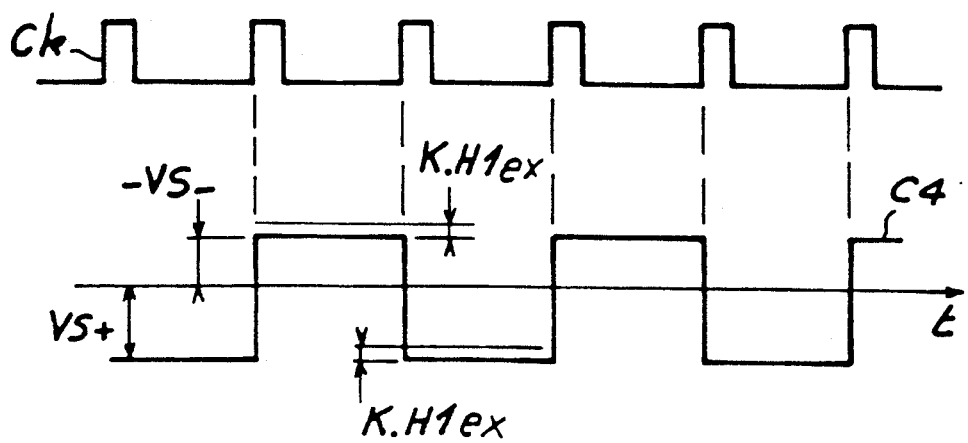
FIG. 12 another chronogram illustrating the operation of the magnetometers shown in FIGS. 7 and 8.

The signal which is present at the output of the sample and hold circuit 38 is represented by the curve C4 of FIG. 12 and is a succession of values $$-K(Hb-Ho+Hlex)+Voff \text{ and}$$
$$-K(-(Hb-Ho)+Hlex)-Voff$$

i.e. VS+ and −VS−, whose mean value is:

$$((VS+)+(-VS-))/2 = -K.Hlex.$$

If Hex varies slowly, it is possible to follow these variations by a simple low-pass filtering at the output of the sample and hold circuit 38. Thus, the slow drifts are eliminated.

Thus, in this sampled system, the sampling frequency fe is the inverse of the time T separating two pulses ck. In accordance with the theory of such systems, the maximum pass band of the input signal (Hlex) is equal to fe/2.

When the switch 42 is on, the output signal of the sample and hold circuit 38 intervenes as an error signal in a control loop. Its mean value is maintained at zero by the loop and, via the integrator 40 and the convertor 44, a feedback current is produced in the coil 24 or 32 and opposes variations of Hex.

In this case, provided that the system has been "hooked" on the resonance, the "following" can significantly exceed the linear part of the curve of FIG. 11, because there is always centering on the resonance. To the first order, the linearity is only dependent on the transfer between the current and the field in the coil 24 and 32.

At the output of the on switch 42, a voltage signal is obtained, which constitutes an image of the feedback field and which is proportional to Hlex. The display means 46 then makes it possible to know Hlex.

Figure 13:
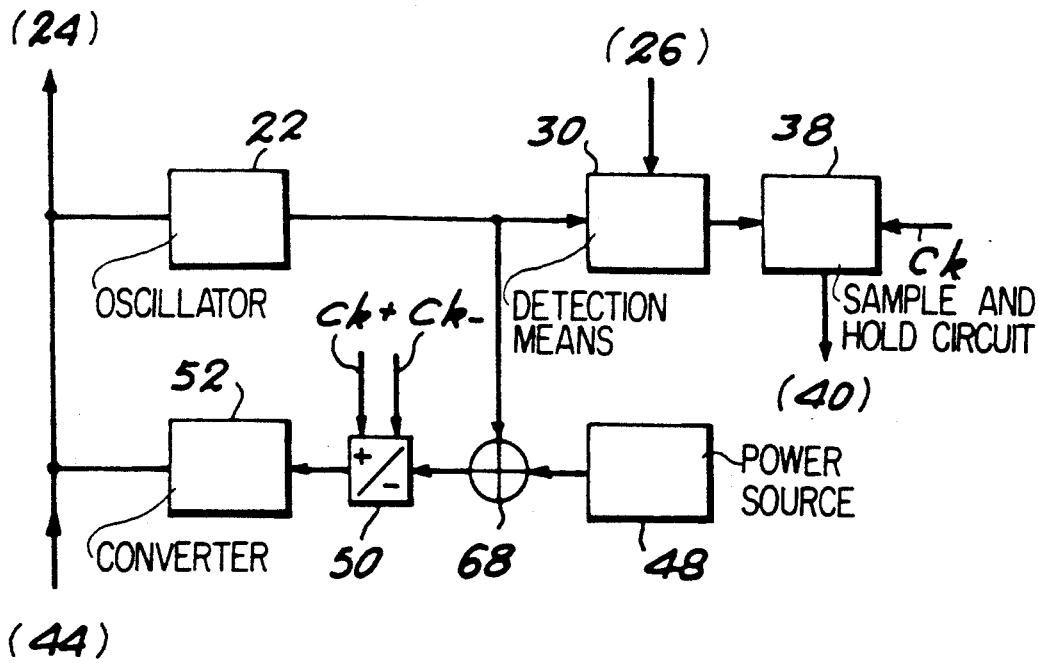
FIG. 13 diagrammatically and partly a constructional variant of the magnetometer of FIG. 8.

A variant of the magnetometer of FIG. 8 is diagrammatically and partly shown in FIG. 13. In this case once again a synchronous detection is used at the audio frequency fm, but the device 36 is eliminated. The sign reversal carried out by the latter is replaced by a 180° switching, at each pulse ck−, of the phase of the exciting signal of frequency fm.

As can be seen in FIG. 13, for this purpose use is made of a summating means 68, which is connected between the voltage source 48 and the device 50. This summating means 68 receives at the input the voltage Vo supplied by the source 48 and the frequency signal fm from the oscillator 22 and supplies the device 50 with the sum of the latter.

In the magnetometers of FIGS. 7 and 8, the use of a symmetrical clock signal generator 54, such as t+ and t— are equal to T, makes it possible to eliminate the sample and hold circuit 38, the output of the device 36 then being directly connected to the integrator 40.

Obviously, by associating three magnetometers according to the invention in such as way that their respective measurement directions are perpendicular to one another, it is possible to measure the three components of the field Hex in accordance with the three directions.

It should be noted that the present invention differs from the prior art through the use of a square wave-pulsed polarization field Hb. The use of a pulsed field Hb makes it possible to eliminate the slow time and temperature drifts, particularly those of the polarization current I (supplied to the coil 24 or 32).

The use of a square-wave field (of period 2T in the case of FIG. 10) makes it possible to work at the maximum slope point (by regulating Vo in the case of FIGS. 7, 8 and 13) of the dispersion curve or the derivative of the absorption curve and consequently improve the S/N ratio.

The sample and hold circuit makes it possible to avoid parasitic oscillations which are liable to occur during the supplying of the coil 24 or 32 by a square-wave current.

The reduction of t+ and t— compared with T (FIG. 9) makes it possible to reduce the power dissipated in coil 24 or 32 and therefore the energy consumption of the magnetometer. The use of a square-wave field Hb associated with a sample and hold circuit also makes it possible to reduce the consumption of the magnetometer.

Another advantage of the present invention, except in the case of FIG. 13, is the compensation of the offset voltages and drifts inherent in an electronic apparatus.

The invention is not limited to electronic resonance. It can apply to nuclear resonance, the sample used in the present invention being able to contain nuclear and e.g. proton spins instead of electron spins.

Figure 14:
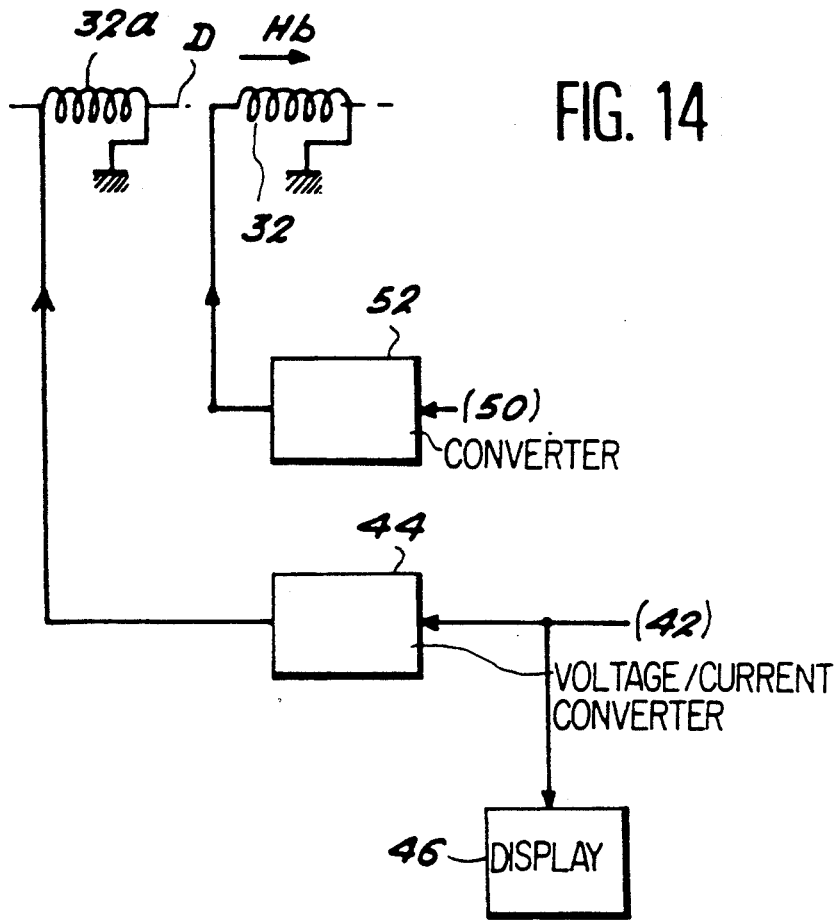
FIGS. 14 to 22 diagrammatically variants of the magnetometers of FIGS. 7 and 8.

In a variant of the magnetometer of FIG. 7, the coil 32 is only connected to the converter 52 and makes it possible to produce the polarization field Hb. Another coil 32a (FIG. 14) having the same axis as the coil 32 is connected on the one hand to ground or earth and on the other to the output of the converter 44 and the coil 32a compensates the field Hlex.

Figure 15:
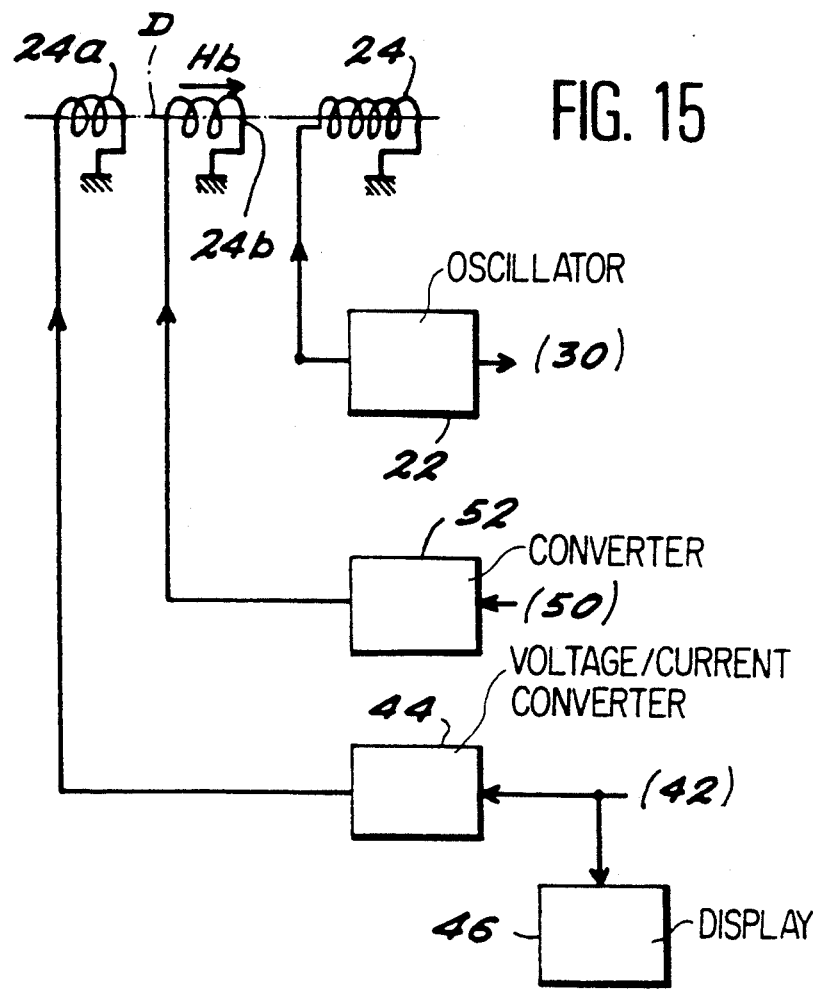

In a variant of the magnetometer shown in FIG. 8, the coil 24 is only connected to the oscillator 22 and makes it possible to produce the audio frequency agitation field. Another coil 24a (FIG. 15) having the same axis as the coil 24 is connected on the one hand to ground and on the other to the output of the converter 44 and the coil 24a compensates the field Hlex. A supplementary coil 24b having the same axis as the coils 24 and 24a is connected on the one hand to ground and on the other to the output of the converter 52 and produces the polarization filed Hb. In a not shown variant of the magnetometer of FIG. 8, use is made of two coils having the same axis, one of them being connected to one of the three elements 22, 44 and 52 with a view to fulfilling one of the three following functions: creation of Hb, creation of the agitation field and compensation of Hlex. The other of the two cells is connected to two others of the three elements with a view to fulfilling the two other functions. For example, one of the two coils is connected to the oscillator 22 for producing the agitation field and the other coil is connected to the converters 44 and 52 for producing the polarization field Hb and for compensating the field Hlex.

The resonant circuit 10 (see FIGS. 7 and 8), which is tuned to the frequency fo, can become deregulated. In order to maintain the resonant circuit 10 tuned to the frequency fo, it is possible to modify the magnetometer shown in FIG. 7, as will be explained hereinafter with reference to FIG. 16.

To the resonant circuit 10 is connected a capacitor c2, a variable capacitance diode D1, a polarization resistor R1 and a capacitor c3. Moreover, to the magnetometer of FIG. 7 are added a sample and hold circuit 10a and an integrator 10b.

In an illustrative and non-limitative manner, the diode D1 is of the type marked by RTC under reference OF 143, the resistor R1 is 100 kiloohms and the capacitors c2 and c3 both have a capacitance of 10 nF.

The terminal B1 of the resonant circuit 10, which is common to the coil 4 and to the variable capacitor c1 and which is grounded, is connected to the anode of the diode D1. The cathode of diode D1 is connected to one terminal of the capacitor c2, (whose function is to prevent the short-circuiting of the diode D1 by the coil 4) and to one terminal of the resistor R1. The other terminal of the capacitor c2 is connected to the other terminal B2 of the variable capacitor c1. The sample and hold circuit 10a is controlled by pulse-type clock signals cb and its input is connected to the output of the balanced mixer 18, while its output is connected to the input of the integrator 10b. The output of the latter is connected to the other terminal of the resistor R1, as well as to a terminal of the capacitor c3, whose other terminal is grounded and whose function is to prevent leaks of high frequency signals towards the integrator 10b, the signals coming from the generator 6.

Figure 17:
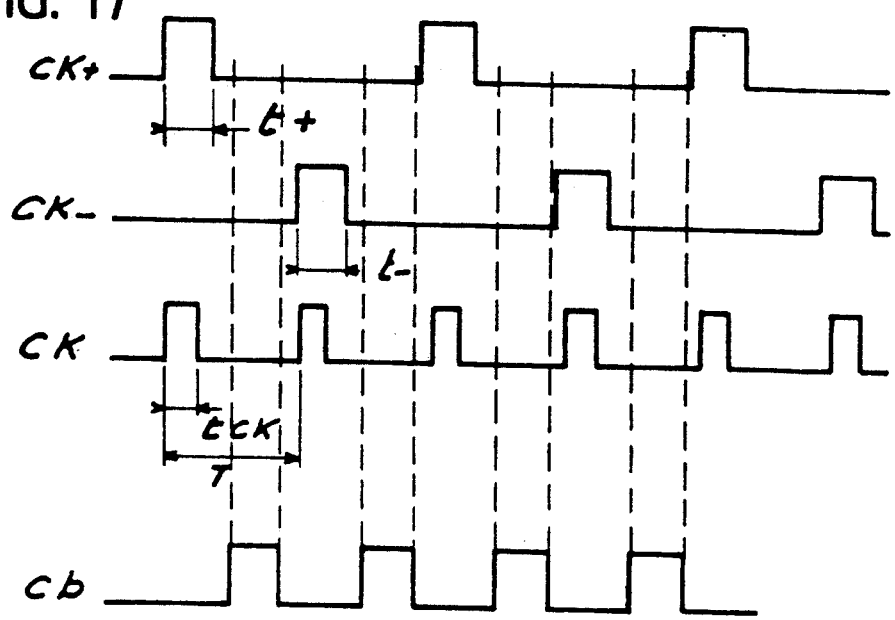

The signals cb used for controlling the sample and hold circuit 10a are defined by positive voltages. These signals cb, whose chronogram is shown in FIG. 17, are square-wave logic signals, whose non-zero pulses appear outside of those of the signals ck+ and ck—. Like the latter, the signals cb are supplied by the generator 54, which is appropriately modified so as to obtain the chronogram of FIG. 17.

The magnetometer of FIG. 8 can be modified in the manner described hereinafter with reference to FIG. 18 in order to maintain its resonant circuit 10 tuned to the frequency fo.

Figure 16:
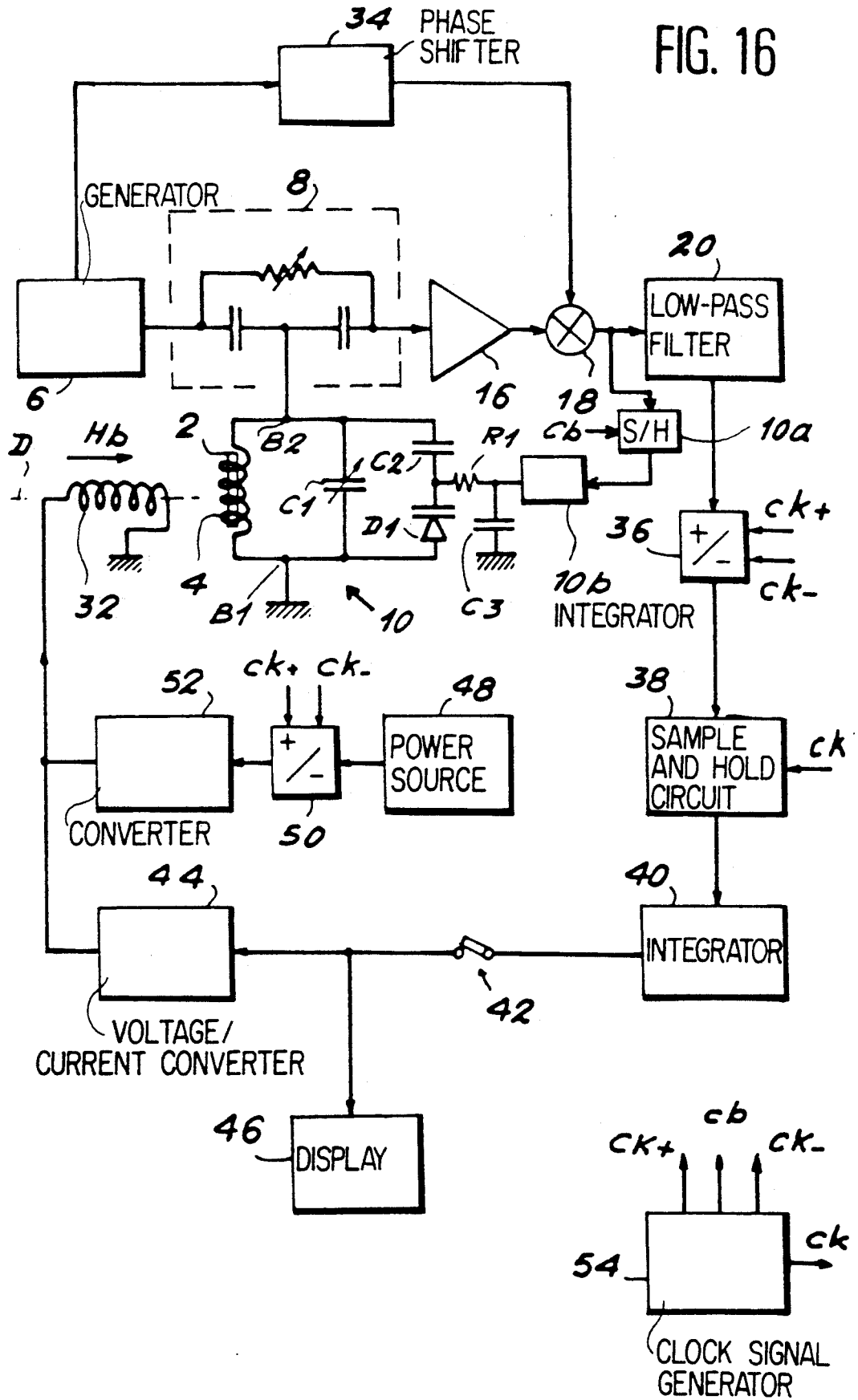
Figure 18:
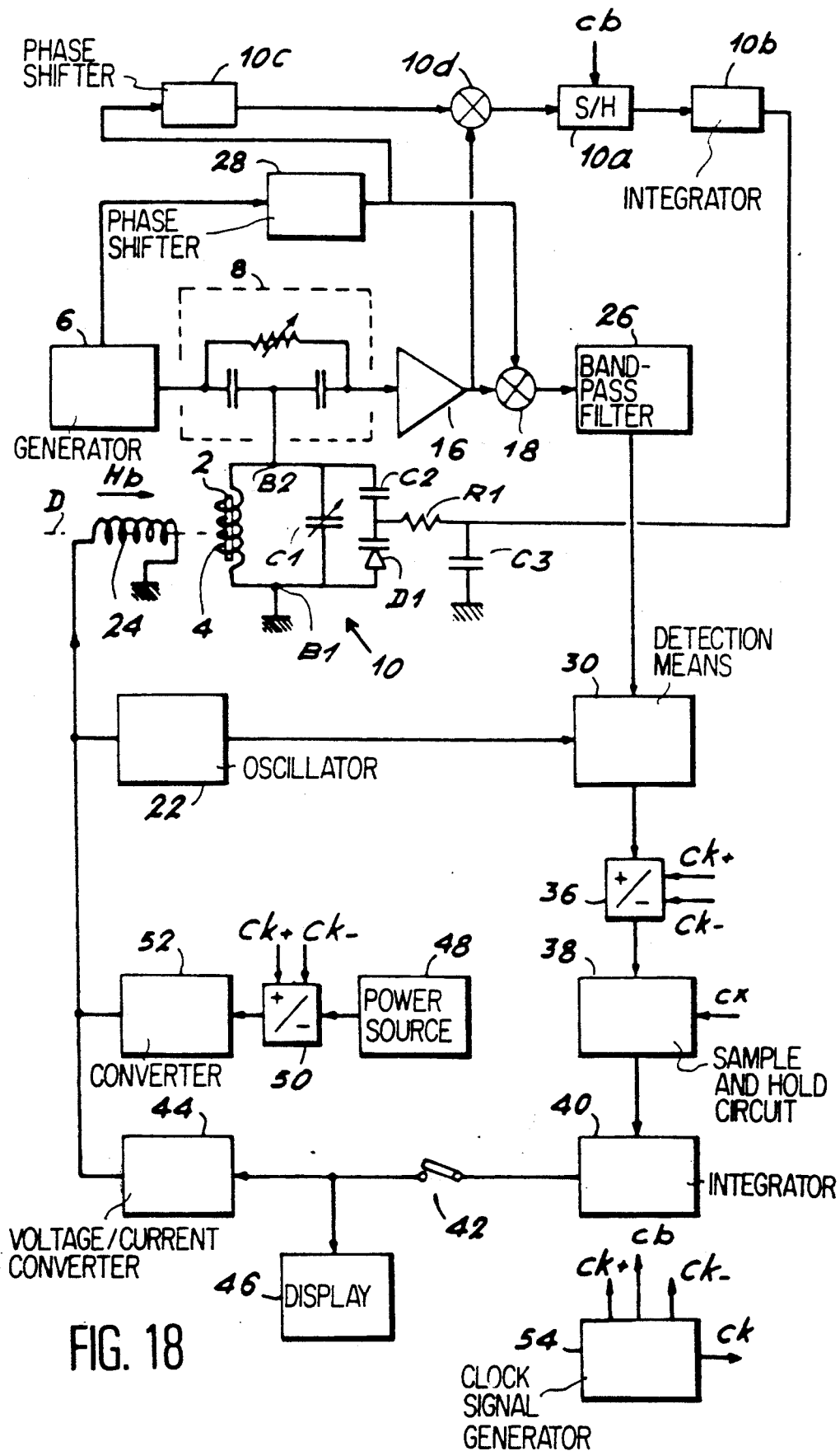

To the magnetometer of FIG. 8 are added the elements c2, c3, D1, R1, 10a and 10b arranged in the same way as in FIG. 16, except that the input of the sample and hold circuit 10a is not, in the case of FIG. 18, connected to the output of the mixer 18. In order to obtain the magnetometer of FIG. 18 addition also takes place to the magnetometer of FIG. 8 of a phase shifter 10c and another balanced mixer 10d (of the same type as mixer 18). The phase shifter 10c receives the high frequency signal from the phase shifter 28 and supplies the mixer 10d with a reference signal, which is phase shifted by +90° or —90° compared with the reference signal of the mixer 18, the sign of the phase shift being chosen in such a way that the closed loop control of the tuning of the resonant circuit is stable. The output signal of the amplifier 16 is also supplied to the input of the mixer 10d, whose output is connected to the input of the sample and hold circuit 10a.

Figure 19:
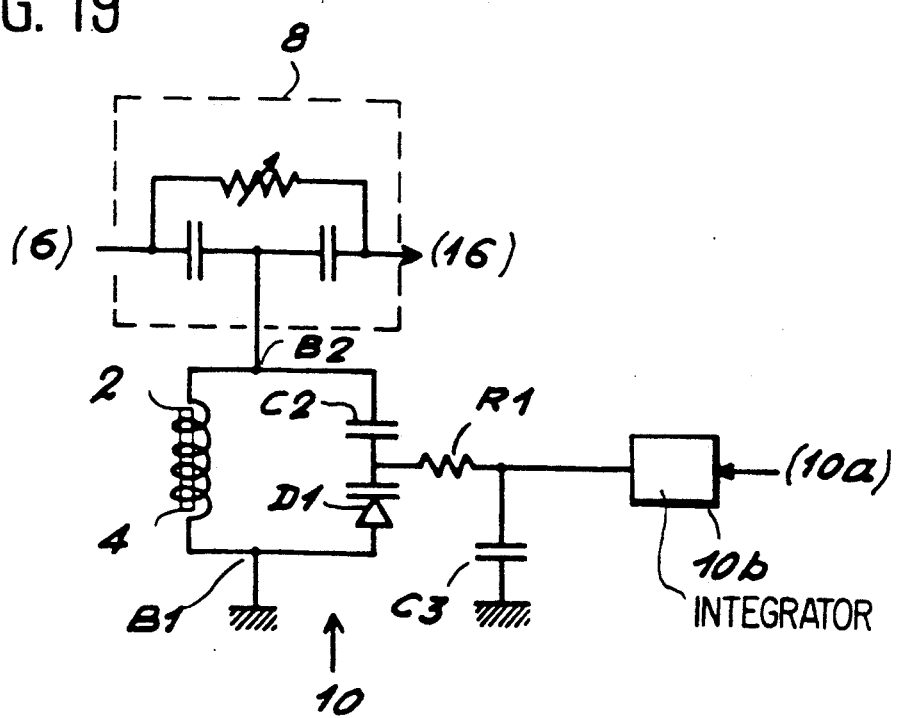

In a variant, the variable capacitor c1 of FIGS. 16 and 18 is eliminated in the manner shown in FIG. 19 and the means D1-c2 is then connected between the terminals B1 and B2.

The magnetometers according to the invention can advantageously be provided with means able to automatically maintain the polarization of the sample 2 at a value Hb1 equal to Ho (or more precisely to maintain respectively equal to Ho and to −Ho, the maximum Hb1 and minimum −Hb1 values of Hb in an automatic manner) by making the voltage source 48 dependent on an error signal Veps obtained by carrying out the operation:

$$Veps=(VS+)+(VS-)=-2K.(Hb-Ho)+2Voff.$$

If it is possible to make Voff small or more precisely negligible compared with K.(Hb−Ho), which is possible by using small drift electronic circuits, the term Veps makes it possible to control the voltage Vo in such a way that Hb1 is strictly equal to Ho. In the absence of this, a slight variation of Hb1 around Ho introduces no magnetometer drift, but leads to a determination of the S/N ratio on passing out of the maximum slope zone of the curve of FIG. 4 or that of FIG. 6 (see also French Patent Application 8809830 and EP-A-0359598). Moreover, the regulating of the source 48 to the value Vo can be difficult if the resonance line is very thin, i.e. if DH1 and DH2 are small compared with Ho. Therefore it is advantageous to automatically maintain the polarization of the sample at the value Ho, because it is then possible to exploit the magnetometer with an optimum S/N ratio and avoid the regulation of the voltage source 48.

This automatic maintenance is obtained (cf. FIGS. 20 and 21) by replacing the source 48 by the association of a sample and hold circuit 70 identical to 38 and an integrator 72 identical to 40.

More precisely, for a magnetometer of the type of FIG. 7, the output signal of the filter 20 (FIG. 20) is supplied not only to the device 36, but also to the sample and hold input 70, which is controlled by the signals ck and whose output is connected to the input of the device 50.

For a magnetometer like that of FIG. 8, it is the output signal of the synchronous detection means 30 (FIG. 21) which is supplied not only to the device 36, but also to the input of the sample and hold circuit 70. The latter is still connected to the integrator 72, which is in turn connected to the device 50, as has been explained relative to FIG. 20.

Thus, at the output of the integrator 72, there is a voltage Vo proportional to Ho (value of the magnetic field connected to the resonant frequency fo of the spins by the Larmor relation).

The magnetometers according to the invention can also advantageously be equipped with means making it possible to eliminate their drifts, due to transfer coefficient variations associated with dimensional variations of the second magnetic means which, in the examples shown, comprise the coils 24, 24a, 24b, 32 and 32a. Thus, another disadvantage of these magnetometers and in fact of all field feedback magnetometers, consists of the dimensional variations of their feedback coil (32 in FIG. 7 and 24 in FIG. 8). These variations are in particular due to temperature.

Thus, the output signal Vmes of the magnetometer, read at the output of the switch 42 (when the latter is on) can be expressed by the relation:

$$Vmes=-A.Hlex.$$

TB is used to designate the ratio between the current in the feedback coil and the feedback field −Hlex and R is the ratio between Vmes and the feedback current due to the converter 44. It is possible to write:

$$A=R.TB \text{ and } Vmes=-R.TB.Hlex.$$

When Hlex is "at the end of the scale", the incidence of the variations of TB on Vmes can be significant. For example, a value of 100 microteslas for Hlex and a desired resolution of 100 picoteslas correspond to a variation of $10^{-6}$, which is acceptable on the product R.TB. Such a precision can be maintained on the element 44, but not on the dimensional variations of the feedback coil (32 in FIG. 7), particularly if the latter is exposed to temperature variations. For a magnetometer to be used in a wide temperature range of e.g. −30° to +70° C. and in the case of a coil support made from a very high performance material, whose expansion coefficient is e.g. $10^{-5}/°C.$, a relative variation of $10^{-3}$ is obtained over the entire temperature range, which leads to an error of 100 nT if the field to be measured is at the end of the scale. In general, this phenomenon is either uncompensated or is compensated by measuring the temperature and by applying correction coefficients, or is eliminated by maintaining the temperature of the second magnetic means at a constant value. The compensation by correction coefficients is limited, the expansion phenomenon often being irreversible. Moreover, the maintaining of a constant temperature requires supplementary means.

In the present invention, the problem of dimensional variations is solved in the following way, provided that the feedback coil and the coil producing the polarization field have the same coefficient TB or coincide (case of FIGS. 7 and 8).

R44 and R52 are the respective voltage/current ratios of the converters 44 and 52 (which are e.g. electrical resistors). It is possible to write:

$$Vo=R52.TB.Ho=R52.TB.2pi.fo/(g.Mo)$$

due to the Larmor relation. It is also possible to write:

$$Vmes=-R44.TB.Hlex.$$

Figure 20:
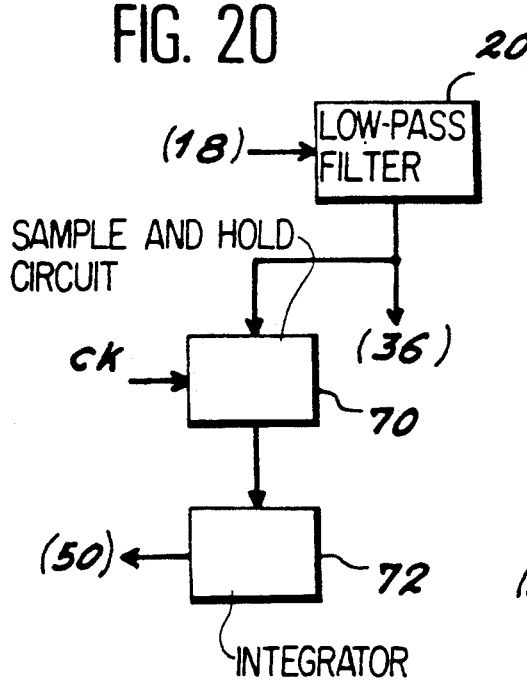
Figure 21:
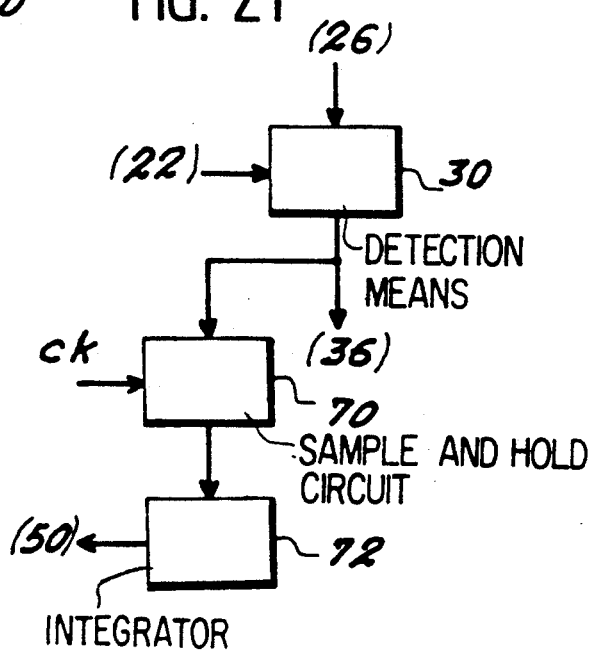
Figure 22:
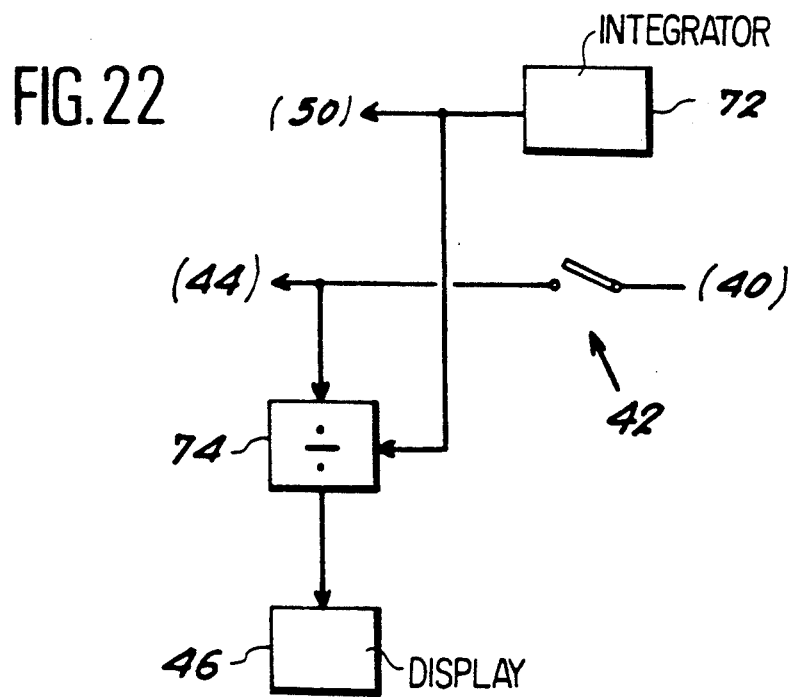

The problem of dimensional variations is solved by adding to the magnetometer of FIG. 20 (or that of FIG. 21) an element 74 (FIG. 22), between the output of the switch 42 and the input of the display means 46. This element 74 receives at the input the output signal of the switch 42 (Vmes) and the output signal of the integrator 72 and is able to perform the operation Vmes/Vo, whose result is consequently supplied to the input of the means 46. This element 74 is either an analog divider of the type marketed by the Analog Device Company, or a known analog-digital means, such as a voltmeter-computer with two inputs then including the function of the element 46, which is eliminated. It is possible to write:

$$Vmes/Vo=-(R44/R52).g.Mo.Hlex/(2pi.fo).$$

Therefore the variations of TB are eliminated. The remaining factors contributing to the accuracy are:

fo whose precision is given by the generator 6 and which can easily reach $10^{-8}$ or higher (on e.g. using a quartz-stabilized oscillator or a thermalized oscillator);

the ratio R44/R52, which is constant if the two converters 44 and 52 derive in the same way (e.g. if they are exposed to the same temperature and have the same thermal drift).

CITED DOCUMENTS (1) F. M. Neubauer et al, The Giotto magnetometer experiment, J. Phys. E:Sci. Instrum., 20, 1987, pp. 714 to 720.
(2) US-A-191118, P. Jung et al.
(3) D. Bourdel et al, An electronic resonance magnetometer, performance optimization (in French), Revue de Physique Appliquée, vol. 5, February 1970, pp. 187 to 190.
(4) D. Bourdel et al, Improvement to the sensitivity of paramagnetic resonance magnetometers (in French), Revue de Physique Apliquée, vol. 7, March 1972, pp. 23 to 27.
(5) French Patent Application 8809830 of Jul. 20, 1988 and EP-A-0359598, D. Duret and M. Beranger.
(6) French Patent Application 8612278 of Sep. 1, 1986, M. Dufour and C. Salvi.
(7) French Patent Application 8717566 of Dec. 16, 1987, J. Crescini and D. Duret.

We claim:

1. Directional resonance magnetometer for measuring a magnetic field H lex, which is the projection, in a given direction, of a magnetic field Hex, said magnetometer comprising:
   a sample made from a material having resonant spins and
   first magnetic means placed in the vicinity of the sample for exciting the resonance of the spins and for detecting the excited resonance,
   said magnetometer being characterized in that it also has second magnetic means placed in the vicinity of the sample, for producing a magnetic polarization field Hb in accordance with the given direction and for compensating the field Hlex and
   processing and closed loop control means connected to the first magnetic means and to the second magnetic means and serving to obtain voltage values respectively proportional to (Hb−Ho+Hlex) and to (Ho−Hb+Hlex) in the vicinity of resonance, Ho being the value of the magnetic field applied to the sample at resonance and being well above Hex, and also serving to obtain a pulsed square-wave current for inducing the field Hb via the second magnetic means and for supplying a voltage Vmes proportional to said field Hlex.

2. Magnetometer according to claim 1, characterized in that the processing and closed loop control means comprises:
   processing means connected to the first magnetic means and to the second magnetic means and serving to obtain on the one hand voltage values respectively proportional to (Hb−Ho+Hlex) and to (Ho−Hb+Hlex) in the vicinity of the resonance, Ho being the value of the magnetic field applied to the sample at resonance and being well above Hex, and on the other hand a pulsed square-wave current for inducing the field Hb via said second magnetic means, and closed loop control means connected on the one hand to the processing means and on the other to the second magnetic means for compensating the field Hlex and for supplying a voltage proportional to said field Hlex.

3. Magnetometer according to claim 2, characterized in that the closed loop control means comprise an integrator, which is controlled by said loop control means, and a voltage-current converter, whose input is connected to the integrator output and whose output supplies the second magnetic-means.

4. Magnetometer according to claim 2, characterized in that the processing means comprise:
   electronic means for supplying the first magnetic means by a current at the Larmor frequency corresponding to Ho and for supplying at the output a voltage signal, whose variations as a function of the magnetic field applied to the same correspond to a dispersion curve of said sample,
   a first electronic device connected to the output of the electronic means and having a voltage gain of alternatively +1 and −1,
   a sample and hold circuit, whose input is connected to the output of the first electronic device and whose output controls the closed loop control means, p1 a voltage source,
   a second electronic device supplied by said voltage source and having a voltage gain of alternatively +1 and −1, and
   a voltage-current converter, whose input is connected to the output of the second electronic device and which supplies the second magnetic means.

5. Magnetometer according to claim 2, characterized in that the processing means comprise:
   electronic means for supplying the first magnetic means by a current at the Larmor frequency corresponding to Ho and for supplying at an output, due to a synchronous detection controlled by a voltage signal at an audio frequency, a voltage signal, whose variations as a function of the magnetic field applied to the sample correspond to a derivative of an absorption curve of said sample,
   a first electronic device connected to the output of the electronic means and having a voltage gain of alternatively +1 and −1,
   a sample and hold circuit, whose input is connected to the output of the first electronic device and whose output controls the closed loop control means,
   a voltage source,
   a second electronic device supplied by said voltage source and having a voltage gain of alternatively +1 and −1, and
   a voltage-current converter, whose input is connected to the output of the second electronic device and which supplies the second magnetic means.

6. Magnetometer according to claim 2, characterized in that the processing means comprise:
   electronic means for supplying the first magnetic means by a current at the Larmor frequency corresponding to Ho and for supplying at an output, due to a synchronous detection controlled by a voltage signal at an audio frequency, a voltage signal, whose variations as a function of the magnetic field applied to the sample corresponds to a derivative of an absorption curve of said sample,
   a sample and hold circuit, whose input is connected to the output of electronic means and whose output controls the closed loop control means,
   a voltage source, a summating means whose output supplies a voltage signal equal to the sum of the voltage of said voltage source and of the voltage signal at an audio frequency, an electronic device connected to the output of the summating means and having a voltage gain of alternatively +1 and −1, and a voltage converter, whose input is connected to the output of the electronic device and which supplies the second magnetic means.

7. Magnetometer according to claim 1, characterized in that the second magnetic means comprise a first magnetic coil for producing the polarization field Hb and a second magnetic coil for compensating the field Hlex, the first and second magnetic coils having the same axis.

8. Magnetometer according to claim 5, characterized in that the second magnetic means comprise a first magnetic coil for producing, in the sample, a magnetic agitation field at the audio frequency, a second magnetic coil for producing the polarization field Hb and a third magnetic coil for compensating the field Hlex, the first, second and third magnetic coils having the same axis.

9. Magnetometer according to claim 5, characterized in that the second magnetic means comprise a first magnetic coil for fulfilling one of the three functions of producing the polarization field, compensating the field Hlex and producing, in the sample, a magnetic agitation field at the audio frequency, and a second magnetic coil for fulfilling the two other of the said three functions, the first and second coils having the same axis.

10. Magnetometer according to claim 1, characterized in that it has a resonant circuit, which incorporates the first magnetic means and which is tuned to the resonant frequency fo, as well as means for maintaining the resonant circuit tuned to the frequency fo.

11. Magnetometer according to claim 1, characterized in that it also comprises means for respectively keeping equal to Ho and −Ho the maximum and minimum values of the polarization field.

12. Magnetometer according to claim 1, characterized in that the second magnetic means comprise a magnetic coil for producing magnetic polarization field Hb, in that the processing and closed loop control means incorporate supply means for the electrical supply of said magnetic coil, said supply means comprising a voltage source, and in that the processing and closed loop control means also incorporate means whose output supplies a signal equal to the voltage Vmes proportional to the field Hlex, divided by the voltage of said voltage source.

13. Magnetometer according to claim 6, characterized in that the second magnetic means comprise a first magnetic coil for producing, in the sample, a magnetic agitation field at the audio frequency, a second magnetic coil for producing the polarization field Hb and a third magnetic coil for compensating the field Hlex, the first, second and third magnetic coils having the said axis.

14. Magnetometer according to claim 6, characterized in that the second magnetic means comprise a first magnetic coil for fulfilling one of the three functions of producing the polarization field, compensating the field Hlex and producing, in the sample, a magnetic agitation field at the audio frequency, and a second magnetic coil for fulfilling the other two of the three functions, the first and second magnetic coils having the same axis.

15. A directional resonance magnetometer for measuring a magnetic field Hlex, which is a projection, in a predetermined direction, of a magnetic field Hex, said magnetometer comprising:

a sample made from a material having resonant spine;

first magnetic means placed in a vicinity of the sample for exciting the resonance of the spins and for detecting the excited resonance, second magnetic means placed in a vicinity of the sample for producing a magnetic polarization field Hb in accordance with the predetermined direction and for compensating the field Hlex; and processing and closed loop control means connected to the first magnetic means and to the second magnetic means for obtaining voltage values respectively proportional to (Hb−Ho+Hlex) and to (Ho−Hb+Hlex) in the vicinity of resonance, Ho being the value of the magnetic field applied to the sample at resonance and being well above Hex, and also for generating a pulsed square-wave current making it possible to induce the field Hb via the second magnetic means and for supplying a voltage Vmes proportional to said field Hlex.

16. The magnetometer according to claim 15, wherein, the processing means is connected to the first magnetic means and to the second magnetic means for obtaining the voltage values respectively proportional to (Hb−Ho+Hlex) and to (Ho−Hb+Hlex) in the vicinity of the resonance, and the pulsed square-wave current making it possible to induce the field Hb via the second magnetic means; and the closed loop control means is connected to the processing means and to the second magnetic means for compensating the first Hlex and for supplying a voltage proportional to said field Hlex.

17. The magnetometer according to claim 16, wherein the closed loop control means comprises an integrator and a first voltage-current converter having an input connected to an output of the integrator and an output for supplying the second magnetic means.

18. The magnetometer according to claim 16, wherein the processing means comprises:

electronic means for supplying the first magnetic means by a current at a Larmor frequency corresponding to Ho and for supplying at its output a voltage signal whose variations as a function of the magnetic field applied to the sample correspond to a dispersion curve of said sample;

a first electronic device connected to an output of the electronic means and permitting a voltage gain of alternatively +1 and −1;

a sample and hold circuit having an input connected to the output of the first electronic device and an output for controlling the closed loop control means;

a voltage source;

a second electronic device supplied by said voltage source and permitting a voltage gain of alternatively +1 and −1; and a voltage-current converter having an input connected to an output of the second electronic device and which supplies the second magnetic means.

19. The magnetometer according to claim 16, wherein the processing means comprises:

electronic means for supplying the first magnetic means by a current at the Larmor frequency corresponding to Ho and for supplying at its output, based on a synchronous detection controlled by a voltage signal at an audio frequency, a voltage signal whose variations as a function of the magnetic field applied to the sample correspond to a derivative of an absorption curve of said sample;

a first electronic device connected to an output of the electronic means and permitting a voltage gain of alternatively +1 and −1;

a sample and hold circuit having an input connected to the output of the first electronic device and whose output controls the closed loop control means;

a voltage source;

a second electronic device supplied by said voltage source and permitting a voltage gain of alternatively +1 and −1; and a voltage-current converter having an input connected to an output of the second electronic device and which supplies the second magnetic means.

20. The magnetometer according to claim 16, wherein the processing means comprises:

electronic means for supplying the first magnetic means by a current at a Larmor frequency corresponding to Ho and for supplying at its output, based on synchronous detection controlled by a voltage signal at an audio frequency, a voltage signal whose variations as a function of the magnetic field applied to the sample correspond to a derivative of an absorption curve of said sample;

a sample and hold circuit having an input connected to an output of the electronic means and whose output controls the closed loop control means;

a voltage source;

a summating means for supplying at its output a voltage signal equal to a sum of said voltage and the voltage signal at an audio frequency;

an electronic device connected to the output of the summating means and permitting a voltage gain of alternatively +1 and −1; and a voltage converter having an input connected to the output of the electronic device and which supplies the second magnetic means.

21. The magnetometer according to claim 15, wherein the second magnetic means comprise a first magnetic coil for producing the polarization field Hb and a second magnetic coil for compensating the field Hlex, the first and second magnetic coils having the same axis.

22. The magnetometer according to claim 19, wherein the second magnetic means comprises a first magnetic coil for producing, in the sample, a magnetic agitation field at the audio frequency, a second magnetic coil for producing the polarization field Hb and a third magnetic coil for compensating the field Hlex, the first, second and third magnetic coils having the same axis.

23. The magnetometer according to claim 19, wherein the second magnetic means comprises a first magnetic coil for fulfilling one of the three functions of producing the polarization field, compensating the field Hlex and producing, in the sample, a magnetic agitation field at the audio frequency, and a second magnetic coil for fulfilling the two other of the said three functions, the first and second magnetic coils having the same axis.

24. The magnetometer according to claim 15, further comprising a resonant circuit which incorporates the first magnetic means and which is tuned to a resonant frequency fo, and means for maintaining the resonant circuit tuned to the frequency fo.

25. The magnetometer according to claim 15, further comprising means for respectively keeping equal to Ho and −Ho the maximum and minimum values of the polarization field.

26. The magnetometer according to claim 15, wherein the second magnetic means comprises a magnetic coil for producing a magnetic polarization field Hb, and wherein the processing and closed loop control means comprises means for the electrical supply of the magnetic coil, said supply means comprising a voltage source and supply means for supplying at its output a signal equal to the voltage Vmes proportional to the field Hlex, divided by the voltage of the voltage source.

27. The magnetometer according to claim 20, wherein the second magnetic means comprises a first magnetic coil for producing, in the sample, a magnetic agitation field at the audio frequency, a second magnetic coil for producing the polarization field Hb and a third magnetic coil for compensating the field Hlex, the first, second and third magnetic coils having the same axis.

28. The magnetometer according to claim 20, wherein the second magnetic means comprises a first magnetic coil for fulfilling one of the three functions of producing the polarization field, compensating the field Hlex and producing, in the sample, a magnetic agitation field at the audio frequency, and a second magnetic coil for fulfilling the other two of the three functions, the first and second magnetic coils having the same axis.

* * * * *